United States Patent
Sengupta et al.

(10) Patent No.: US 6,753,922 B1
(45) Date of Patent: Jun. 22, 2004

(54) IMAGE SENSOR MOUNTED BY MASS REFLOW

(75) Inventors: Kabul S. Sengupta, Tempe, AZ (US); Azar Assadi, Tempe, AZ (US); Alan B. Alley, Phoenix, AZ (US); Robert C. Sundahl, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 682 days.

(21) Appl. No.: 09/172,734

(22) Filed: Oct. 13, 1998

(51) Int. Cl.[7] ............................................. H04N 5/225
(52) U.S. Cl. ..................... 348/374; 257/782; 438/118
(58) Field of Search ............................... 348/374, 340, 348/297; 257/783, 782, 784, 778, 668; 438/108, 118, 119; 174/259, 260

(56) References Cited

U.S. PATENT DOCUMENTS

| | | | | |
|---|---|---|---|---|
| 4,771,929 A | * | 9/1988 | Bahr et al. .................. 228/102 |
| 4,827,118 A | * | 5/1989 | Shibata et al. .............. 250/211 |
| 4,893,171 A | * | 1/1990 | Denda ......................... 357/72 |
| 5,175,410 A | * | 12/1992 | Freedman et al. ..... 219/121.63 |
| 5,227,604 A | * | 7/1993 | Freedman ............... 219/121.63 |
| 5,358,904 A | * | 10/1994 | Murakami et al. .......... 437/209 |
| 5,362,680 A | * | 11/1994 | Heinen et al. ............... 437/209 |
| 5,468,681 A | * | 11/1995 | Pasch ......................... 437/183 |
| 5,536,908 A | * | 7/1996 | Etchells et al. .............. 174/257 |
| 5,550,087 A | * | 8/1996 | Brossart ..................... 437/217 |
| 5,561,539 A | * | 10/1996 | Funahata et al. ............. 359/50 |
| 5,591,490 A | * | 1/1997 | Quate ......................... 427/457 |
| 5,627,913 A | * | 5/1997 | Spigarelli et al. ........... 382/151 |
| 5,721,076 A | * | 2/1998 | Watanabe et al. .............. 430/7 |
| 5,863,814 A | * | 1/1999 | Alcoe et al. ................. 438/117 |
| 6,034,423 A | * | 3/2000 | Mostafazadeh et al. ..... 257/691 |
| 6,040,633 A | * | 3/2000 | Manteghi ..................... 257/784 |
| 6,144,107 A | * | 11/2000 | Narita ......................... 257/783 |
| 6,207,947 B1 | * | 3/2001 | Wester ....................... 250/226 |
| 6,292,218 B1 | * | 9/2001 | Parulski et al. ........... 348/220.1 |

* cited by examiner

Primary Examiner—Wendy R. Garber
Assistant Examiner—Jacqueline Wilson
(74) Attorney, Agent, or Firm—Blakely, Sokoloff, Taylor & Zafman LLP

(57) ABSTRACT

An imaging system includes an image sensor that is attached to a circuit board via a mass reflow process. The image sensor captures image data and provides the image data at an output of the imaging system. In one embodiment, the image sensor uses a color filter array (CFA) material that is substantially stable through the mass reflow process.

7 Claims, 6 Drawing Sheets

IMAGE SENSOR MOUNTED BY MASS REFLOW

BACKGROUND OF THE INVENTION

1. Field of the Invention

The described invention relates to the field of integrated circuit packages. In particular, the invention relates to an integrated circuit package capable of being mounted to a circuit board via a mass reflow process.

2. Description of Related Art

A windowed integrated circuit package is used for various applications in which an integrated circuit is illuminated or irradiated by light or other radiation sources located outside the integrated circuit package. An image sensor is one use of a windowed integrated circuit package.

For example, a photodiode array may be placed within a windowed integrated circuit package. The photo-detector array provides an image data output based upon the light incident on the photo-detector array. The photo-detector array may be used for capturing images or for other image reproduction applications. A color filter array (CFA) material is used with the photo-detector to filter the light impinging on the image sensor to allow for the formation of full color images. Each filter allows a predetermined color of light to reach a corresponding photo-detector, thus determining what color light will be sensed by the photo-detector. By grouping sets of light sensors together, the intensity and color of light reaching an area can be determined.

Integrated circuit (IC) packages are mounted on circuit boards by various techniques including mass reflow and manual and hot bar soldering of the package to the circuit board. Manual soldering and hot bar soldering, however, are relatively slow and expensive processes.

Mass reflow board mounting is a faster, automated process. Mass reflow refers to one of several different techniques that raise the temperature of the IC package to approximately 215 to 225 degrees C. At these elevated temperatures, solder residing on pads of the integrated circuit board melts and adheres to leads on the IC package. After the solder cools, the IC package remains firmly coupled to the solder pads. Mass reflow includes infrared, convection, and vapor phase techniques.

Non-ceramic packages such as windowed plastic packages are more desirable than ceramic packages because they are of lower cost than corresponding ceramic windowed packages. However, available windowed plastic packages do not meet the thermal requirements for mass reflow board mounting. These windowed plastic packages are mounted to circuit boards using techniques such as manual soldering that keep the package bulk from reaching the elevated temperatures of the mass reflow process.

Standard windowed plastic packages tested on the mass reflow process exhibit problems such as cracked lids, lid-sealant separation due to thermal expansion mismatch between the plastic and glass window, and delamination of the die from the die attach.

Another problem with using mass reflow on image sensors is that the CFA material is not stable at high temperatures. For example, CFA material made with molecular dyes are often used in image sensors. Dyed CFA material, such as dyed polyimide, may become yellow-tinged when exposed to the high temperatures of mass reflow. This impacts the color performance of the image sensor.

SUMMARY OF THE INVENTION

An imaging system includes an image sensor that is attached to a circuit board via a mass reflow process. The image sensor captures image data and provides the image data at an output of the imaging system. In one embodiment, the image sensor uses a color filter array (CFA) material that is substantially stable through the mass reflow process.

DETAILED DESCRIPTION

An image sensor capable of being mounted via a mass reflow process is disclosed. Applicants have found that modifying a windowed plastic QFP package available through Kyocera Corporation based in Kyoto, Japan allows the plastic package to withstand the mass reflow process without the lid separating from the mold package or the die delaminating from the mold package. Additionally, using a CFA material with high temperature stability allows the image sensor to maintain its color performance despite being exposed to a mass reflow process.

The Package

The following section describes one embodiment of a package used to house the image sensor. The package is also described in co-pending U.S. patent application, Ser. No. 09/172,710 entitled "Mass Reflowable Windowed Non-Ceramic Package," assigned to Intel Corporation and Kyocera Corporation. This plastic package is preferred due to lower cost. However, the mass reflow process may also be applied to a windowed package made of ceramic instead of plastic.

Windowed plastic packages may be used to house an image sensor. In one embodiment, an image sensor die has dimensions larger than 240 mils by 240 mils. A direct glass-to-plastic seal is not achieved for the package housing such a large die. Instead, a ceramic frame is employed to allow a ceramic-to-plastic coupling and a ceramic-to-glass coupling, as will be described.

Figure 1:
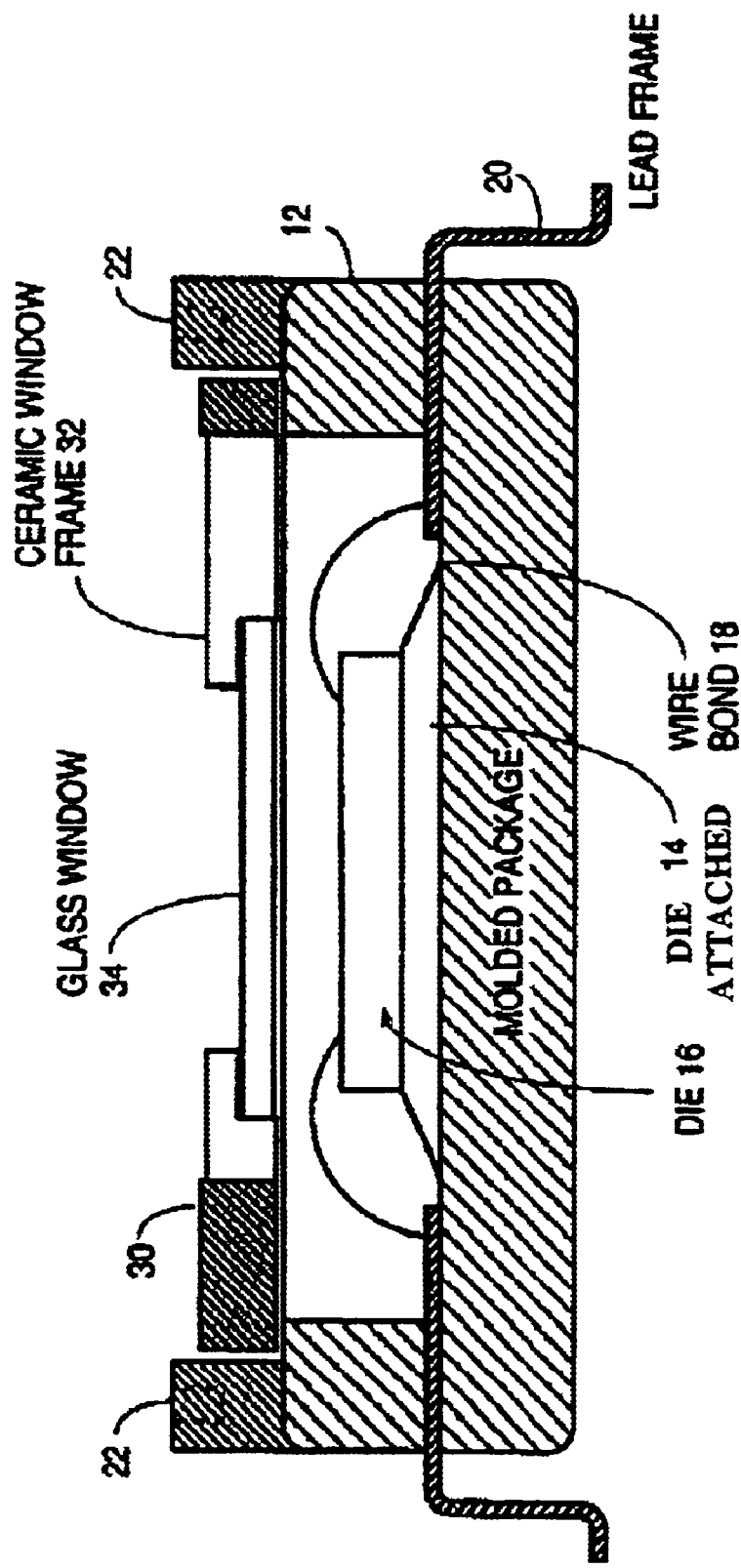
FIG. 1 shows a cross sectional block diagram of the windowed QFP package 10 as modified by the Applicants.

FIG. 1 shows a cross sectional block diagram of a windowed QFP package 10 that is mass reflowable. A non-ceramic mold package 12 makes up the package body. In one embodiment, the non-ceramic mold package is made with a low-moisture plastic, such as a low-moisture mold compound of ortho-cresol-novolac developed by Kyocera Corporation. In one embodiment, depressions 22 indicate where ejector pins were used to remove the mold package after being formed. Appendix 1 includes an example of the material characteristics of a low-moisture mold compound of Kyocera Corporation.

Die attach 14 is used to hold the die 16 in place. In one embodiment, the die attach 14 is a low rigidity epoxy such as a silver-filled epoxy manufactured by Ablestik Electronic Materials and Adhesives, based in Rancho Dominguez, Calif.

Wire bonds 18 attach the die 16 to a lead frame 20. The die attach 14 is selected to withstand the elevated temperatures of the mass reflow process. Delamination of the die 16 from the die attach 14 or mold package 12 may be a problem during mass reflow. Applicants have determined that a two step cure process for the die attach, as will be discussed with respect to FIG. 3, solves this problem.

A lid 30 seals the mold package. In one embodiment, the lid 30 comprises a ceramic frame 32 made of alumina. The ceramic frame 32 holds a transparent window. In one embodiment, the ceramic frame 32 includes a recessed ledge within which a glass window 34 resides. In one embodiment, the mold package 12 and the ceramic frame 32 are sealed using a bis-phenol A type epoxy. The epoxy seal may also be used to seal the ceramic frame 32 to the glass window 34. Appendix 2 summarizes the characteristics of a bis-phenol A-type sealant that is suitable for use with the present invention.

The modified windowed package is particularly suited for, but not limited to, Complementary Metal Oxide Semiconductor (CMOS) image sensors because their die size can exceed 240 mils by 240 mils. An embodiment of the package suitable for an image sensor includes a window having a slightly larger area than that of the light-sensitive portion of the die.

Figure 2:
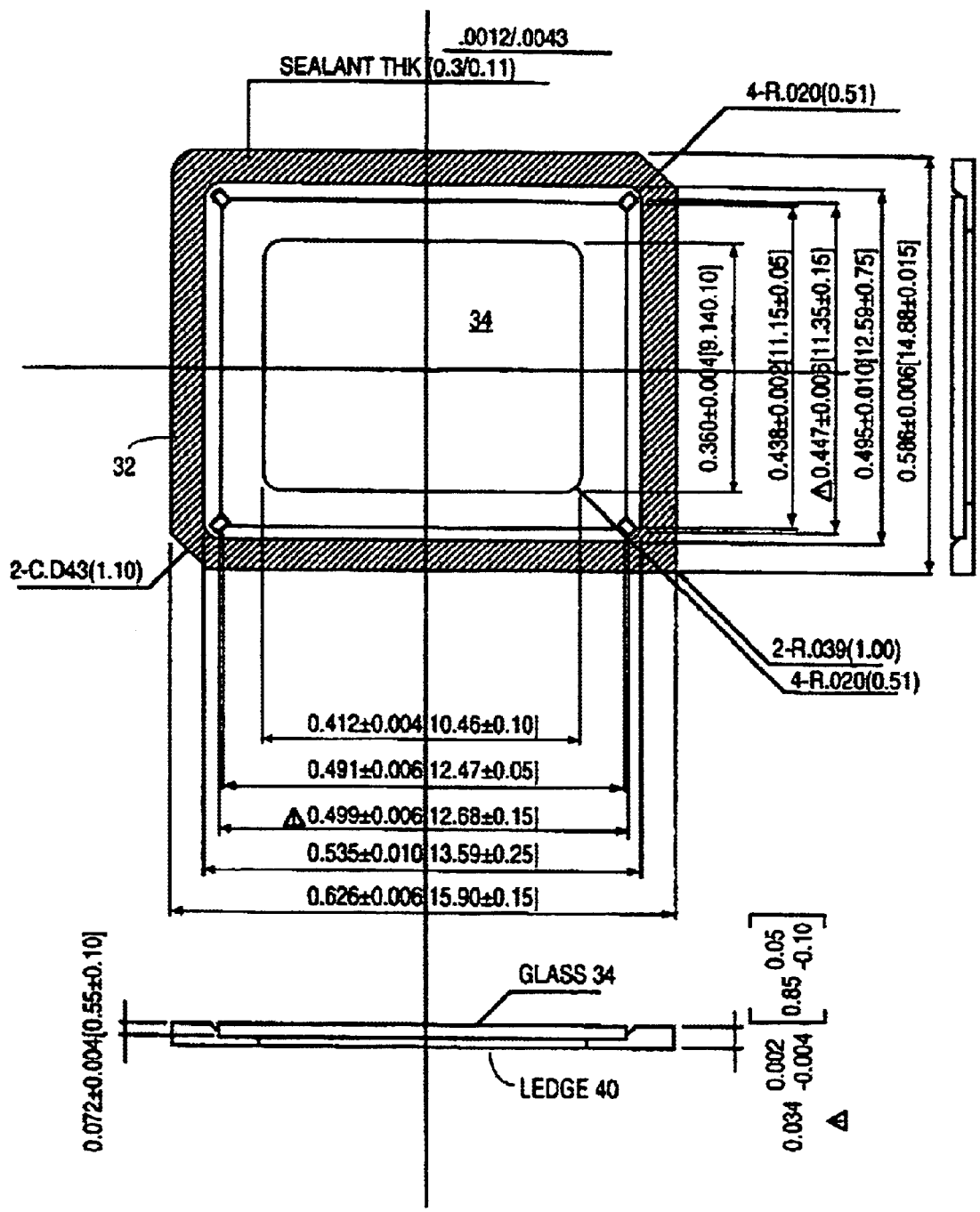
FIG. 2 shows a schematic of one embodiment of the package lid, including the ceramic frame and glass window.
Figure 3:
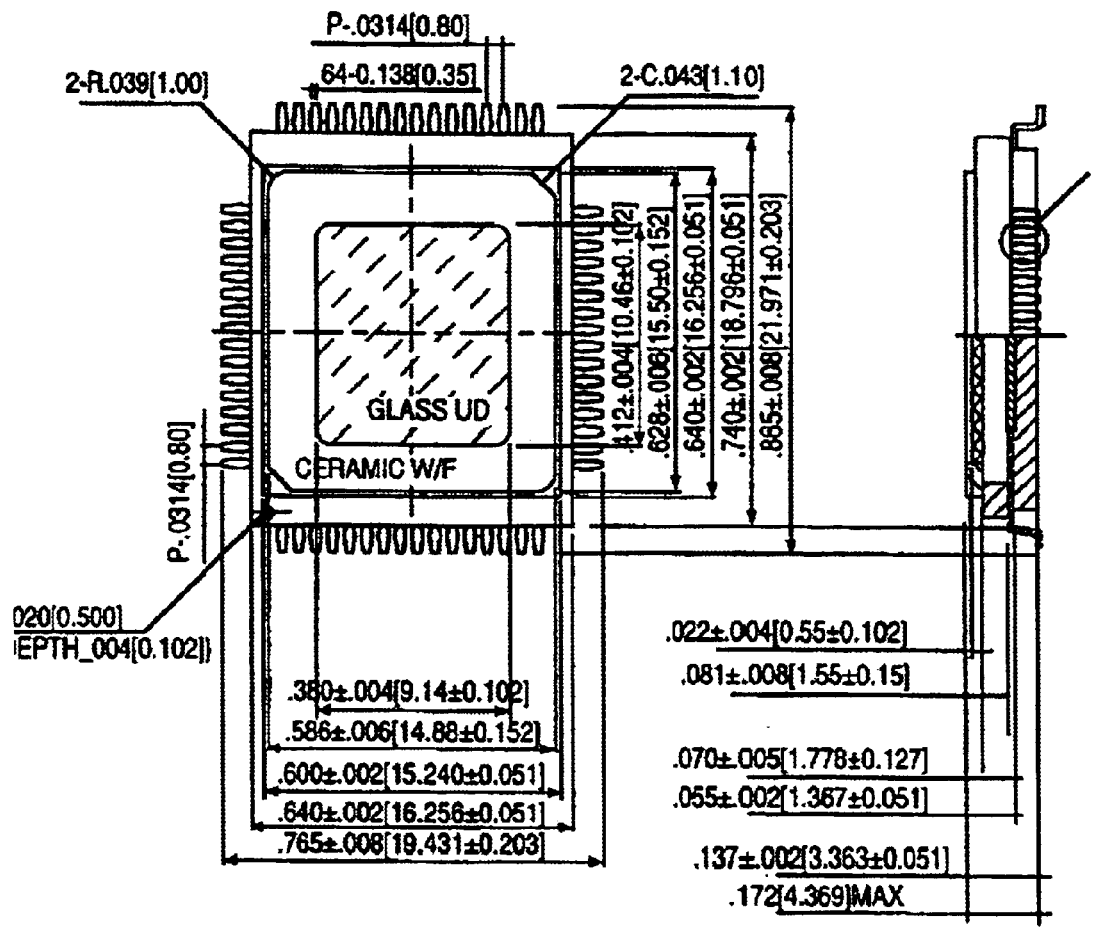
FIG. 3 shows a schematic of one embodiment of the entire IC package.

In one embodiment, the window is approximately 1.2 times the area of the light-sensitive portion of the die. The window size, however, varies depending on its distance away from the die. FIGS. 2 and 3 shows schematic diagrams of one embodiment of the lid and mold package.

FIG. 2 shows a schematic of one embodiment of the package lid 30, including the ceramic frame 32 and glass window 34. In one embodiment, a glass window 34 is seated into a recessed ledge 40 in the ceramic frame 32.

FIG. 3 shows a schematic of one embodiment of the entire IC package 50 in accordance with present invention. Although the embodiment shown includes a particular type of lead frame (quad flat pack—QFP), other types of lead frames may be employed. Moreover, other packages may be used, including leadless packages such as micro ball grid array (micro BGA), leadless chip carrier (LCC), dual in-line package (DIP), and so forth.

Figure 4:
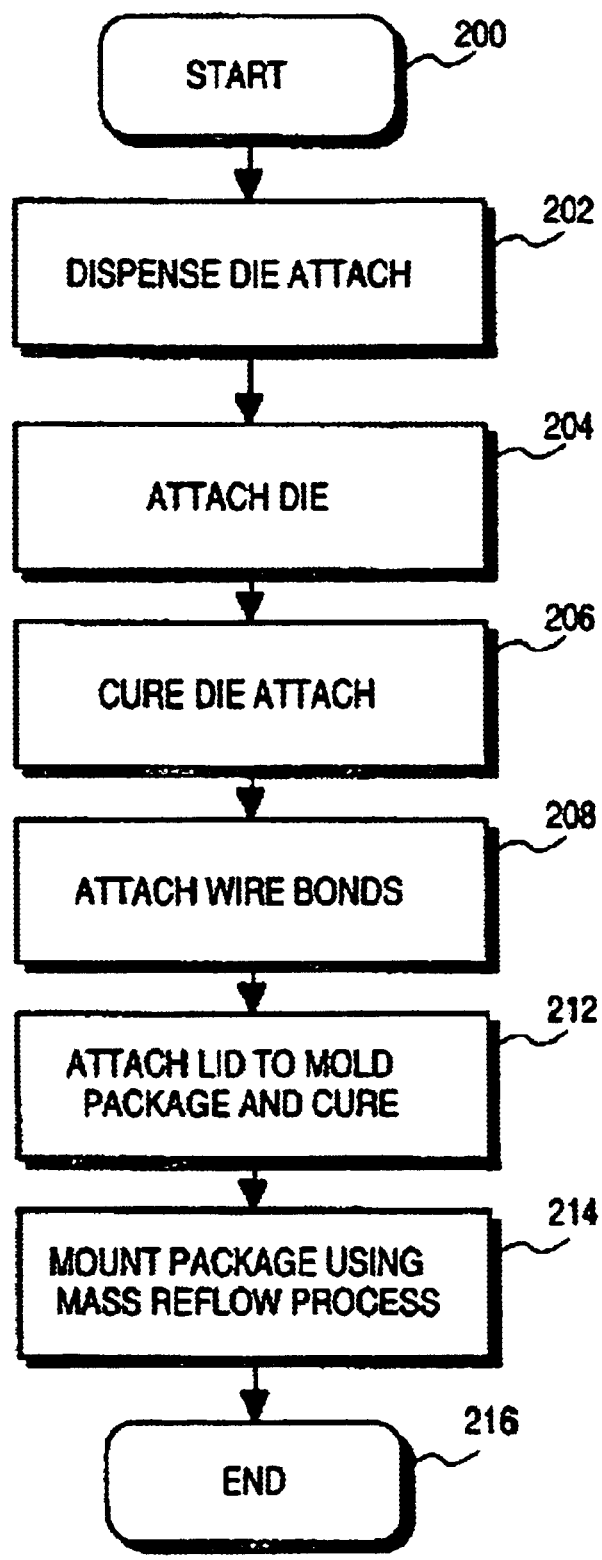
FIG. 4 shows one embodiment of the process taken in attaching a die into a windowed non-ceramic package.

FIG. 4 shows the process steps taken in one embodiment of a method for attaching a die into a windowed non-ceramic package. At step 202, die attach is dispensed on the mold package. In one embodiment, the die attach is comprised of a low rigidity epoxy such as a silver-filled epoxy, as previously stated.

The process continues at block 204, at which the die is scrubbed, or moved back and forth while pressure is applied to firmly attach the die to the die attach. Good adhesion of the die to a smooth surface of the mold package is achieved without plating the back-side of the die with gold.

The die attach is cured at block 206. It is important to eliminate voids in the die attach, which may cause delamination problems. It has been found that a two stage cure process works better than a one stage cure process for eliminating voids in the die attach. In one embodiment, the die attach is baked at approximately 100 degrees C. for approximately one hour, then the die attach is baked at approximately 150 degrees C. for approximately another hour.

At block 208, wire bonds are attached between the die and the lead frame of the mold package.

At block 212, the lid is attached to the mold package. In one embodiment, the lid comprises the glass window 34 attached to the ceramic frame 32 with a bis-phenol A type epoxy. The epoxy is cured by baking. In one embodiment, the curing is performed by raising the temperature to approximately 150 degrees C. for approximately 70 minutes.

In one embodiment, the lid is attached to the mold package using the same epoxy that was used to attach the glass window 34 to the ceramic frame 32, and the epoxy is cured by also raising the temperature to approximately 150 degrees C. for approximately 70 minutes.

In one embodiment, the above steps are performed using laminar flow hoods in a clean room that meets level class sub 100, in which there is less than 100 particles of contamination of one micron or less per cubit meter. This helps to prevent particle contamination of the die during assembly.

In one embodiment, the window has a scratch-dig specification of 20 microns. The scratch-dig specification denotes the largest allowable defect in the glass. A larger defect may interfere with the imaging performance of the image sensor.

In order to reduce moisture in the sealed package prior to performing the mass reflow process, an extended bake cycle is used just prior to bag. In one embodiment, the sealed package is baked at 125 degrees C. for 48 hours, then it is vacuum sealed in a moisture barrier bag for storage or shipment. This allows the sealed package to meet the Institute for Interconnecting and Packaging Electronic Circuits (IPC) level 4 surface mount requirements. (The IPC is a trade association representing over 2300 companies in the electronic interconnection industry worldwide.)

When the sealed package is ready to be mounted, it is removed from the bag and mounted to a circuit board using a mass reflow process, as shown at block 214. There are various types of mass reflow processes. In one embodiment, an IR/convection mass reflow process is employed that conforms to the following:

1) peak package body temperature of approximately 225 degrees C.;
2) time above 215 degrees C. is approximately 30 seconds;
3) time above 183 degrees C. is approximately 140 seconds.

The windowed non-ceramic package is able to withstand the above mass reflow process without the lid separating from the mold package or die detaching from the mold package.

The Die and CFA Material

In one embodiment, a pigmented color filter array (CFA) material is deposited on top of each photo-detector. Typically, one of the colors red, green or blue is deposited in a mosaic pattern. Pigments are chosen as the colorants over molecular dyes because of their superior light, heat, and chemical stability. Table 1 shows an example of the composition of the pigments used by Applicants. Applicant has found the CFA material to be extremely stable over various temperatures. This CFA material has previously been used in liquid crystal display (LCD) technology but has not been used as a color filter in image capture.

Figure 5:
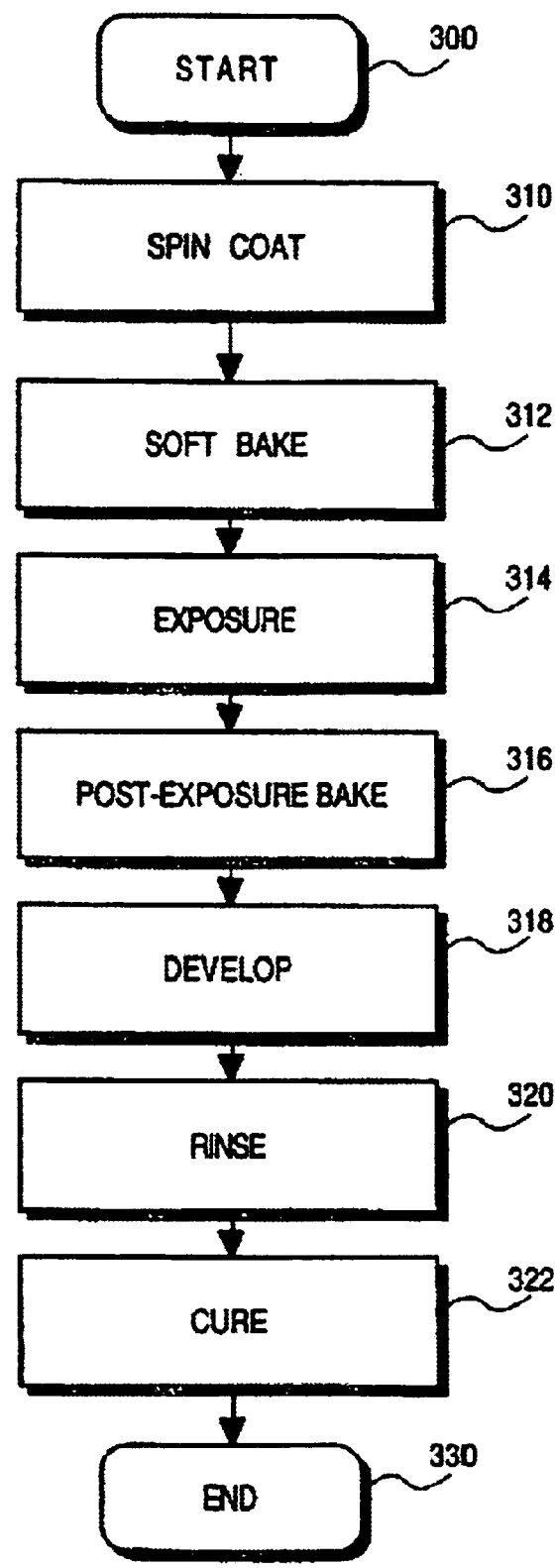
FIG. 5 shows one embodiment of the color filter process.

FIG. 5 shows one embodiment of the color filter process. The flowchart starts at block 300, and continues with block 310, at which the pigmented CFA material is deposited via a spin coat process. In one embodiment, the spin coating is applied at 4000 RPM for approximately 30 seconds. At block 312, the CFA is put through a soft bake phase in which the part is baked for about one minute at approximately 90 degrees C. At block 314, the CFA is exposed. In one embodiment, a mercury lamp of 500 W (I-line) is used.

A post exposure bake of about three minutes at approximately 180 degrees C. is performed at block 316. At block 318, the CFA is developed. In one embodiment, the developing is performed at about 27 degrees C. for approximately one minute to achieve a critical dimension of 20%. The part is then rinsed at block 320, then cured at block 322. Curing is performed for approximately 3 minutes at approximately 180 degrees C.

In one embodiment, a solvent of approximately 76 wt % of propylene glycol monomethyl ether acetate (PGMEA) and approximately 5 wt % of cyclohexanone is used to disperse the CFA material in the spin coating step (block 310), and a developer of between approximately 0.13 wt % and 0.14 wt % tetramethyl ammonium hydroxide is used in the developer step (block 318).

The flowchart steps are repeated for each of the different pigmented CFA materials. For example, in one embodiment, the flowchart steps are performed to apply a red, green then blue pigmented CFA material. However, various orders of applying the different colors of CFA materials may be used. Additionally, other color pigments may be used.

In one embodiment, the CFA material is deemed stable after the mass reflow process, if its color characteristics remain within a range that allows the image sensor to provide an image output of acceptable quality to a human observer. For example, a) the color characteristics of the image sensor may shift slightly during mass reflow, but the shift in image output is still less than human perception, or b) the color characteristics of the image sensor shift during mass reflow, but the shift in image output can be compensated to provide an image that is acceptable to a human observer.

One way in which the CFA stability can be measured quantitatively is by determining a color difference $\Delta EL_{a^*b^*}$. In one embodiment, a pass/fail threshold is based on $\Delta EL_{a^*b^*}$. For example, the CFA material can be considered to be substantially stable only if its color difference changes by less than a $\Delta EL_{a^*b^*}$ of 5 from being exposed to the mass reflow process. Of course, other values of $\Delta EL_{a^*b^*}$ can be implemented as the pass/fail threshold.

In one embodiment, the average color for each of the channels red, green, and blue is measured by the image sensor before and after the mass reflow process. The color difference $\Delta EL_{a^*b^*}$ is determined, as is well-known. For example, color difference $\Delta EL_{a^*b^*}$ is described in Color Science: Concepts and Methods, Quantitative Data and Formulae, $2^{nd}$ edition, Gunter Wyszecki, W. S. Stiles (John Wiley & Sons, 1982).

The CFA material also may be used to provide a scratch protection layer as described in co-pending U.S. patent application Ser. No. 08/986,501, entitled "Passivation Protection On Sensor Devices During Electronic Assembly," assigned to the common corporate assignee. In one embodiment, a red pigment layer and a green pigment layer of CFA material having a thickness of approximately 600 microns is applied to the perimeter of a die to provide scratch protection of the underlying circuitry while handling the die.

Imaging System

Figure 6:
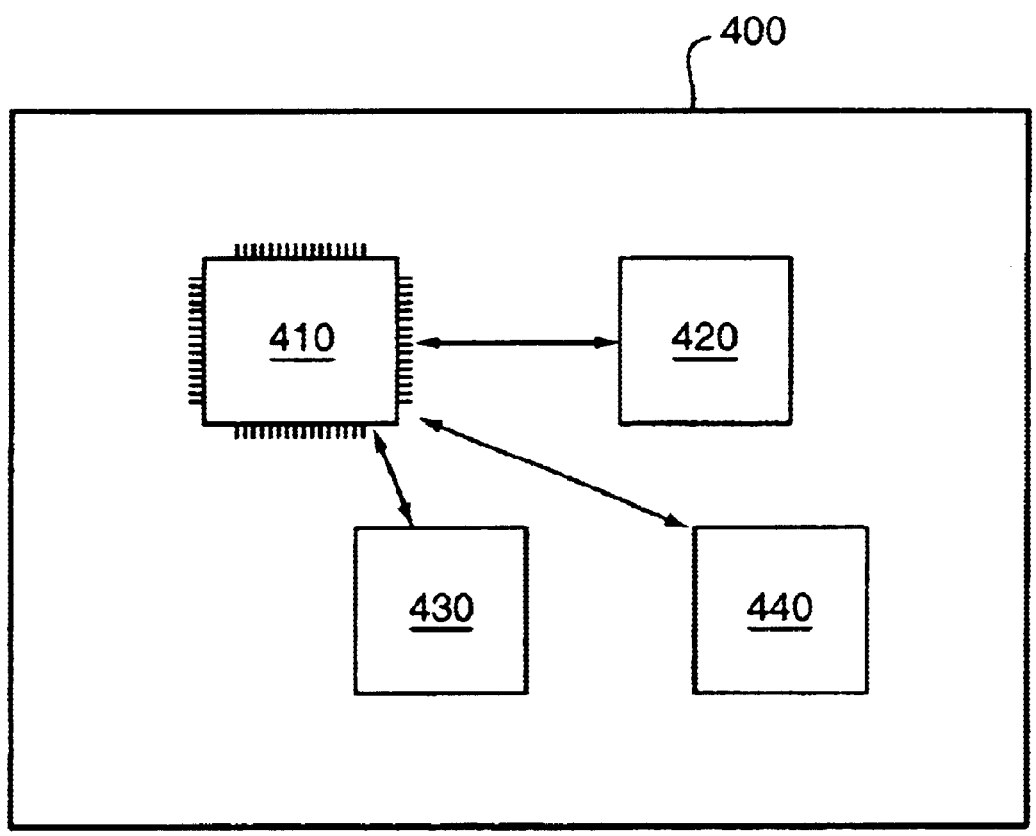
FIG. 6 shows an imaging system comprising an image sensor attached to a circuit board via a mass reflow process.

FIG. 6 shows an imaging system 400 comprising an image sensor attached to a circuit board via a mass reflow process. The image sensor 410 is employed as part of a camera, silicon eye, or other image device. Typically, the image sensor is electrically coupled to an image processor 420 and a memory 430. The imaging system may also include interconnect circuitry 440 for communicating with other systems, such as a host computer system or other output device. The imaging system may also include a lens system (not shown) to focus the light on the image sensor, as is well-known in the art.

The ability to attach the image sensor via the mass reflow process reduces costs and speeds up the manufacturing process. It also may provide a more reliable connection then manual soldering methods.

Thus, an image sensor capable of being mounted to a circuit board via a mass reflow process is disclosed. The specific arrangements and methods described herein are merely illustrative of the principles of this invention. Numerous modifications in form and detail may be made without departing from the scope of the described invention. Although this invention has been shown in relation to a particular embodiment, it should not be considered so limited. Rather, the described invention is limited only by the scope of the appended claims.

TABLE 1

Composition of Pigment-dispersed Photopolymers

Composition

| | |
|---|---|
| Monomer | Polyfunction Acrylates 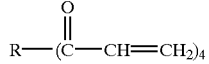 |
| Binder | Acrylic acid/Acrylate Copolymers 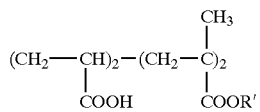 |
| Initiator | Ditrihalomethyl-s-triazines 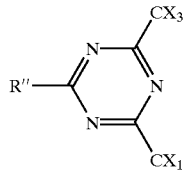 |
| Pigment (main) | Red: Diantraquinones<br>Green: Halo-Cu-phthalocyanines<br>Blue: Cu-phthalocyanines<br>Black: Carbon |
| Pigment (color matching) | YellowA: Isoindolins<br>YellowB: Diazo compounds<br>Violet: Dioxazines |
| Solvent | Cellusolves |

APPENDIX 1

MATERIAL CHARACTERISTICS
(GENERAL PROPERTIES OF EO1B)

| PROPERTY | NOMINAL VALUE |
|---|---|
| THERMAL CONDUCTIVITY [ROOM TEMP.] | 0.8 w/m · k |
| THERMAL EXPANSION ($\alpha 1$) | $150 \times 10-7/^\circ$ C., $490 \times 10-7/^\circ$ C. |
| BENDING STRENGTH | 0.14 GPa |
| BENDING ELASTICITY | 18 GPa |
| GLASS TRANSITION TEMPERATURE (Tg) | 163° C. |
| VOLUME RESISTIVITY [ROOM TEMP.] | $2 \times 10^{15}$ $\Omega$ · cm |
| DIELECTRIC CONSTANT [1 MHz] [ROOM TEMP.] | 3.8 |
| $\alpha$ COUNT EMISSION (DPH) | 0.06 COUNTS/cm2 Hr |

APPENDIX 2

No KSD-248-0108-1

| TECHNICAL SHEET | KYOCERA CORPORATION SEMICONDUCTOR PARTS DIVISION4 |
|---|---|
| SEALANT | SEALANT DIVISION NCO-150H |

1 Physical Property

| Item | Unit | Data |
|---|---|---|
| Color | | Translucence |
| Specific Gravity | | 1.7 |
| * Shear Strength | MPa | 26.48 |
| Coefficient of Thermal Expansion | $1/°C. \times 10^{-5}$ | 7 |
| Glass Transition Point | °C. | 160 |
| Water Absorption | % | — |
| Dielectric Constant | $\epsilon$ (1 MHz) | 6 |
| Loss Factor | $\tan \delta$ (1 MHz) | 0.03 |
| Thermal Conductivity | W/m · K | — |
| Surface Resistivity | Ω | $1.0 \times 10^{14}$ |

Note
* Curing Sample: Ceramic/Ceramic

2 Reliability (Judgment: MIL-STD 883D 1014)

| Test Item | MIL-STD 883D | Condition | NG: N = 100 |
|---|---|---|---|
| Temperature Cycle | 1010-COND C | −85° C. ~ 150° C. 40 Cycles | 0/100 |
| Thermal Shock | 1011-COND A | 0° C. ~ 100° C. 40 Cycles | 0/100 |
| Impact Resistance | 2002-COND B | 1500 G, 0.5 M, 5 Times | 0/100 |
| High Temp Storage | 1008-COND C | 160° C./1000 H | 0/100 |
| Low Temp Storage | | −85° C./1000 H | 0/100 |
| High Temp & Humidity | | 85° C., 85% RH, 1000 H | 0/100 |
| Pressure Cooker | | 121° C., 0.21 MPa, 50 H | 0/100 |

APPENDIX 2-continued

No KSD-248-0108-1

| TECHNICAL SHEET | KYOCERA CORPORATION SEMICONDUCTOR PARTS DIVISION4 |
|---|---|
| SEALANT | SEALANT DIVISION NCO-150H |

Note
Ceramic Curing (.709 inch SQ: Sealing Width .040 inch)

What is claimed is:

1. A method of attaching an image sensor to a circuit board, the method comprising:

applying a color filter array (CFA) material to a die;

bonding the die to a package;

attaching the package to a circuit board via a mass reflow process.

2. The method of claim 1, wherein the applying comprises:

applying a pigmented CFA material to the die.

3. The method of claim 1, wherein the attaching comprises:

heating the package to over 200 degrees C.

4. The method of claim 1, wherein the attaching comprises:

heating the package to approximately 215 degrees C.

5. The method of claim 1 further comprising:

baking the package for an extended time prior to the attaching.

6. The method of claim 5, wherein the baking is performed at over 125 degrees C. for over 24 hours.

7. The method of claim 6, where in the baking allows the package to meet IPC level 4 surface mount requirements.

* * * * *